(12) United States Patent
Sim et al.

(10) Patent No.: US 12,167,622 B2
(45) Date of Patent: Dec. 10, 2024

(54) ELECTRONIC DEVICE

(71) Applicant: Samsung Display Co., Ltd., Yongin-si (KR)

(72) Inventors: Jin Yong Sim, Seongnam-si (KR); Hoseung Kang, Asan-si (KR); Minseop Kim, Cheonan-si (KR); Young Do Kim, Cheonan-si (KR); Heeyoung Lee, Hwaseong-si (KR); Seohyeon Choi, Hwaseong-si (KR); Sung Chul Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 235 days.

(21) Appl. No.: 17/348,171

(22) Filed: Jun. 15, 2021

(65) Prior Publication Data
US 2022/0139274 A1    May 5, 2022

(30) Foreign Application Priority Data

Nov. 5, 2020  (KR) ........................ 10-2020-0146725

(51) Int. Cl.
*H10K 50/842*   (2023.01)
*B32B 3/26*     (2006.01)
(Continued)

(52) U.S. Cl.
CPC ......... *H10K 50/8426* (2023.02); *B32B 3/266* (2013.01); *B32B 7/12* (2013.01);
(Continued)

(58) Field of Classification Search
CPC .. H10K 50/8426; H10K 50/865; B32B 3/266; B32B 7/12; B32B 15/08; B32B 2255/26; B32B 2264/108; B32B 2307/41; B32B 2457/20; G06F 1/1637; G06F 1/1641; G06F 1/1652; G06F 1/1656; G06F 1/1616;
(Continued)

(56) References Cited

U.S. PATENT DOCUMENTS 9,801,290 B2   10/2017  Ahn
10,367,164 B2  7/2019   Ahn et al.
(Continued)

FOREIGN PATENT DOCUMENTS

KR  10-2016-0087972   7/2016
KR  10-2016-0144912   12/2016
(Continued)

OTHER PUBLICATIONS

Chen et al, WO-2019237484-A1 Machine Translation, Dec. 2019 (Year: 2019).*

(Continued)

*Primary Examiner* — Nathan L Van Sell
(74) *Attorney, Agent, or Firm* — KILE PARK REED & HOUTTEMAN PLLC

(57) ABSTRACT

Disclosed is an electronic device including a window, a display panel disposed under the window, a support member disposed under the display panel, a cover layer disposed under the support member, and an adhesive layer disposed between the support member and the cover layer. Each of the adhesive layer and the cover layer includes a light shielding material.

20 Claims, 10 Drawing Sheets

(51) Int. Cl.
  *B32B 7/12* (2006.01)
  *B32B 15/08* (2006.01)
  *H10K 50/86* (2023.01)
(52) U.S. Cl.
  CPC ........... *B32B 15/08* (2013.01); *H10K 50/865* (2023.02); *B32B 2255/26* (2013.01); *B32B 2264/108* (2013.01); *B32B 2307/41* (2013.01); *B32B 2457/20* (2013.01)
(58) Field of Classification Search
  CPC ........... G06F 1/1628; G06F 2200/1635; G09F 9/301; C09J 9/00
  See application file for complete search history.

(56) References Cited

U.S. PATENT DOCUMENTS

| | | | |
|---|---|---|---|
| 10,433,438 | B2 | 10/2019 | Moon et al. |
| 2005/0244644 | A1* | 11/2005 | Hampden-Smith .... H01B 1/122 428/408 |
| 2009/0137731 | A1* | 5/2009 | Sekiyama ............ C09D 11/037 524/588 |
| 2010/0120997 | A1* | 5/2010 | Kirino .................... C09C 1/565 525/535 |
| 2016/0327977 | A1* | 11/2016 | Tang ..................... H01L 21/565 |
| 2018/0088631 | A1 | 3/2018 | Park et al. |
| 2018/0366685 | A1 | 12/2018 | Park et al. |
| 2019/0131374 | A1 | 5/2019 | Kishimoto |
| 2019/0165311 | A1* | 5/2019 | Lee ........................ C09J 175/08 |
| 2020/0073441 | A1 | 3/2020 | Shin |
| 2020/0132989 | A1 | 4/2020 | Park et al. |

FOREIGN PATENT DOCUMENTS

| | | |
|---|---|---|
| KR | 10-2017-0003801 | 1/2017 |
| KR | 10-2017-0087000 | 7/2017 |
| KR | 10-2017-0087008 | 7/2017 |
| KR | 10-2018-0029590 | 3/2018 |
| KR | 10-2020-0028063 | 3/2020 |
| KR | 10-2020-0050057 | 5/2020 |
| KR | 10-2020-0062827 | 6/2020 |
| KR | 10-2021-0153495 | 12/2021 |

OTHER PUBLICATIONS

JP-3251869-B2 Translation, Anami K et al(Year: 2002).*
Extended European search report for European Patent Application or Patent No. 21200637.3 dated Apr. 28, 2022.

* cited by examiner

ELECTRONIC DEVICE

CROSS-REFERENCE TO RELATED APPLICATION(S)

This application claims priority to and the benefit of Korean Patent Application No. 10-2020-0146725 under 35 U.S.C. § 119, filed on Nov. 5, 2020, in the Korean Intellectual Property Office (KIPO), the disclosures of which are incorporated by reference herein in their entireties.

BACKGROUND

Embodiments of the disclosure described herein relate to an electronic device, and more specifically, relate to an electronic device capable of improving display efficiency by preventing external light from being incident while improving impact resistance.

An electronic device includes an active area that is activated in response to an electrical signal. The electronic device may sense an input applied from the outside through the active area and may simultaneously display various images to provide information to a user. Recently, as electronic devices of various shapes have been developed, active areas having various shapes are implemented.

SUMMARY

Embodiments of the disclosure provide an electronic device capable of improving display efficiency by preventing external light from being incident while improving impact resistance.

According to an embodiment, an electronic device may include a window, a display panel disposed under the window, a support member disposed under the display panel, a cover layer disposed under the support member, and an adhesive layer disposed between the support member and the cover layer. Each of the adhesive layer and the cover layer includes a light shielding material.

The support member may include a plate having metal, and the cover layer may be attached to a lower part of the plate by the adhesive layer.

The plate may include a first non-folding area, a folding area, and a second non-folding area arranged in a first direction, and the plate may further include a plurality of openings overlapping the folding area in a plan view.

The cover layer may overlap the folding area of the plate in a plan view.

The adhesive layer may overlap the folding area of the plate in a plan view.

The light shielding material included in each of the cover layer and the adhesive layer may include reactive carbon black.

The cover layer may further include a cover base material including a silicone resin, a polyurethane resin, or a thermoplastic polyurethane resin, and a first functional group included in the light shielding material and a second functional group included in the cover base material may be chemically bonded.

The adhesive layer may further include an adhesive base material including an acrylic resin, and the first functional group included in the light shielding material and a third functional group included in the adhesive base material may be chemically bonded.

The electronic device according to an embodiment of the disclosure may further include a light shielding layer disposed on the support member.

The electronic device according to an embodiment of the disclosure may further include a lower protective film disposed under the display panel, and an additional adhesive layer disposed between the lower protective film and the light shielding layer, and the additional adhesive layer may contact the lower protective film and the light shielding layer.

The cover layer may include a first light shielding material, the light shielding layer may include a second light shielding material, and the first light shielding material and the second light shielding material may be different from each other.

The electronic device according to an embodiment of the disclosure may further include cushion member disposed between the support member and the display panel.

The adhesive layer may contact a lower surface of the support member and an upper surface of the cover layer.

The electronic device according to an embodiment of the disclosure may further include a lower support member disposed under the cover layer.

The cover layer may be a flexible film

An electronic device may include a display panel having a first state being flat or a second state being folded, a support member disposed under the display panel, including a first non-folding area, a folding area, and a second non-folding area arranged in a first direction, the support member further including a plurality of openings overlapping the folding area in a plan view, a cover layer disposed under the support member and overlapping at least the folding area in a plan view, and an adhesive layer disposed between the support member and the cover layer. Each of the cover layer and the adhesive layer may include a light shielding material.

The light shielding material included in each of the cover layer and the adhesive layer may include reactive carbon black.

The cover layer may further include a cover base material, the adhesive layer further includes an adhesive base material, in the cover layer, the light shielding material is chemically bonded to the cover base material, and in the adhesive layer, the light shielding material is chemically bonded to the adhesive base material.

According to an embodiment, an electronic device includes a window, a display panel disposed under the window, a metal plate disposed under the display panel, a light shielding layer disposed directly on the metal plate, a cover layer disposed under the metal plate, and an adhesive layer disposed between the metal plate and the cover layer. Each of the adhesive layer and the cover layer includes a light shielding material.

The metal plate may include a first non-folding area, a folding area, and a second non-folding area arranged in a first direction, and the metal plate further including a plurality of openings overlapping the folding area in a plan view. The cover layer may overlap at least the folding area in a plan view.

BRIEF DESCRIPTION OF THE DRAWINGS

The above and other objects and features of the disclosure will become apparent by describing in detail embodiments thereof with reference to the accompanying drawings.

DETAILED DESCRIPTION OF THE EMBODIMENTS

Figure 1A:
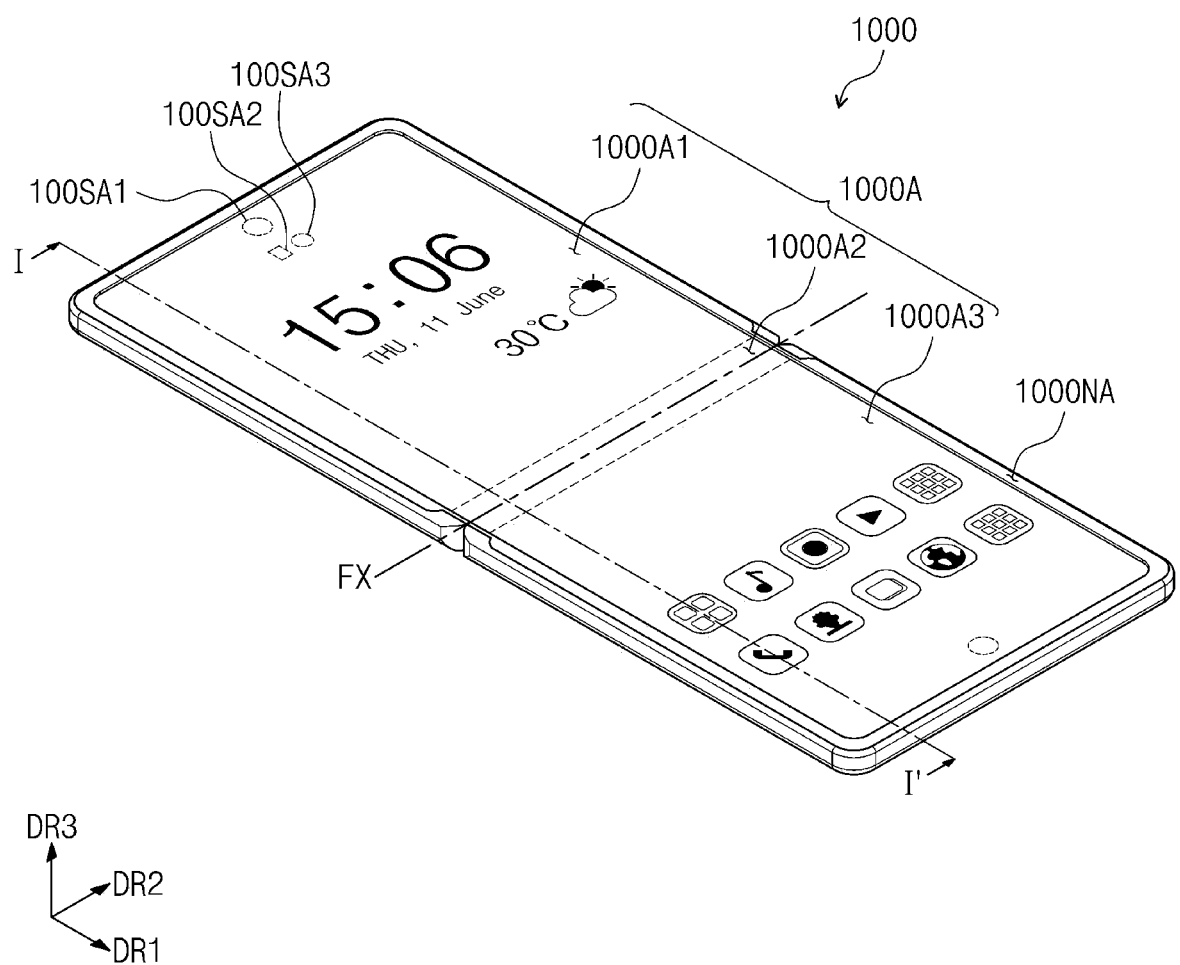
FIG. 1A is a schematic perspective view of an electronic device in an unfolded state according to an embodiment of the disclosure.

Hereinafter, embodiments of the disclosure will be described with reference to the drawings.

In the specification, when one component (or area, layer, part, or the like) is referred to as being "on," "connected to," or "coupled to" another component, it should be understood that the former may be directly on, connected to, or coupled to the latter, and also may be on, connected to, or coupled to the latter via a third intervening component.

Like reference numerals refer to like components. Also, in drawings, the thickness, ratio, and dimension of components may be exaggerated for effectiveness of description of technical contents. The term "and/or" includes one or more combinations of the associated listed items.

The terms" "first," "second," and the like are used to describe various components, but the components are not limited by the terms. The terms are used only to differentiate one component from another component. For example, a first component may be named as a second component, and vice versa, without departing from the spirit or scope of the disclosure. A singular form, unless otherwise stated, includes a plural form.

Also, the terms "under," "beneath," "on," "above" are used to describe a relationship between components illustrated in a drawing. The terms are relative and are described with reference to a direction indicated in the drawing.

It will be understood that the terms "include," "comprise," "have," etc. specify the presence of features, numbers, steps, operations, elements, or components, described in the specification, or a combination thereof, not precluding the presence or additional possibility of one or more other features, numbers, steps, operations, elements, or components or a combination thereof.

In the specification, the expression "directly disposed" may mean that there is no layer, film, region, plate, or the like added between a part, such as a layer, a film, a region, a plate, or the like, and another part. For example, the expression "directly disposed" may mean "being disposed" without using an additional member, such as an adhesive member, between two layers or two members.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the drawings.

Figure 1B:
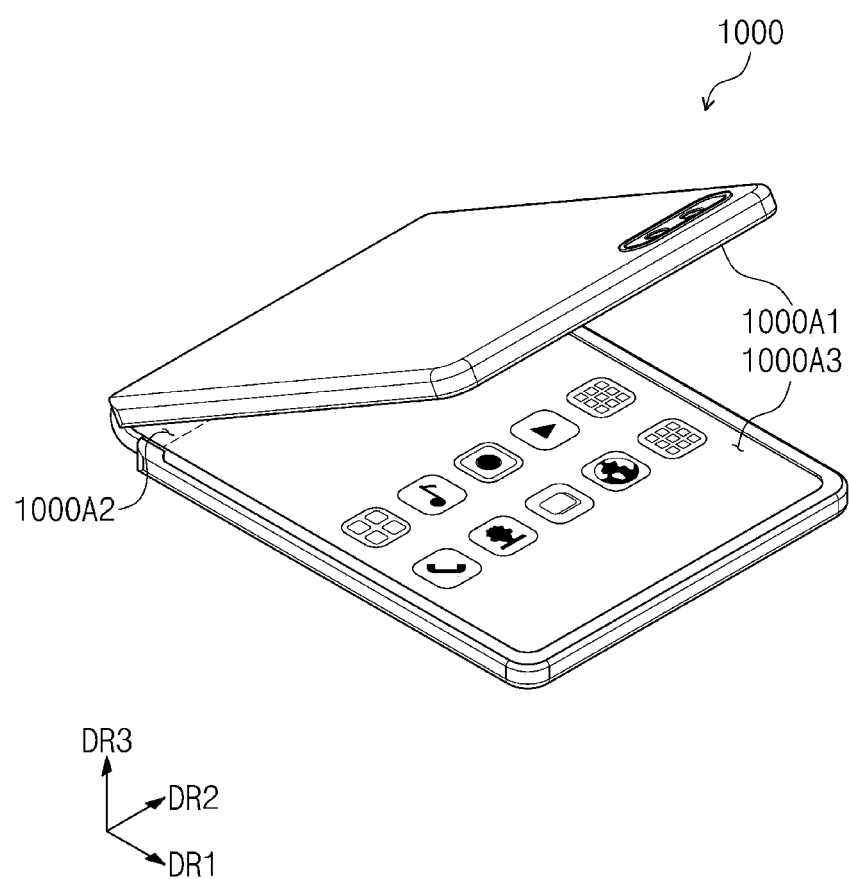
FIG. 1B is a schematic perspective view of an electronic device in a folded state according to an embodiment of the disclosure.

FIG. 1A is a schematic perspective view of an electronic device according to an embodiment. FIG. 1B is a schematic perspective view of an electronic device according to an embodiment. FIG. 1A illustrates a state in which an electronic device 1000 is unfolded, and FIG. 1B illustrates a state in which the electronic device 1000 is folded.

Referring to FIGS. 1A and 1B, the electronic device 1000 may be a device that is activated in response to an electrical signal. For example, the electronic device 1000 may be, but is not limited thereto, a mobile phone, a tablet, a car navigation system, a game console, or a wearable device. FIG. 1A illustrates that an electronic device 1000 is, for example, a mobile phone.

The electronic device 1000 may display an image through an active area 1000A. In case that the electronic device 1000 is unfolded, the active area 1000A may include a plane defined by a first direction DR1 and a second direction DR2. A thickness direction of the electronic device 1000 may be parallel to a third direction DR3 intersecting the first direction DR1 and the second direction DR2. Accordingly, a front surface (or an upper surface) and a rear surface (or a lower surface) of each of components constituting the electronic device 1000 may be defined with respect to the third direction DR3.

The active area 1000A may include a first area 1000A1, a second area 1000A2, and a third area 1000A3. The second area 1000A2 may be bent around a folding axis FX extending in the second direction DR2. Accordingly, the first area 1000A1 and the third area 1000A3 may be referred to as non-folding areas, and the second area 1000A2 may be referred to as a folding area.

In case that the electronic device 1000 is folded, the first area 1000A1 and the third area 1000A3 may face each other. Accordingly, in a fully folded state, the active area 1000A may not be exposed to the outside, and this may be referred to as in-folding. However, this is just an embodiment, and an operation of the electronic device 1000 is not limited thereto.

For example, in an embodiment, in case that the electronic device 1000 is folded, the first area 1000A1 and the third area 1000A3 may be opposed to each other (or may be opposite to each other). Accordingly, in the folded state, the active area 1000A may be exposed to the outside, and this may be referred to as out-folding.

The electronic device 1000 may perform only one of the in-folding operation or the out-folding operation. As another example, the electronic device 1000 may perform both the in-folding operation and the out-folding operation. A same area of the electronic device 1000, for example, the second area 1000A2 may be in-folded and out-folded. As another example, an area of the electronic device 1000 may be in-folded, and another area thereof may be out-folded.

FIGS. 1A and 1B illustrate a folding area and two non-folding areas as an example, but the number of folding areas and the number of non-folding areas are not limited thereto. For example, the electronic device 1000 may include more than two non-folding areas and folding areas each disposed between adjacent non-folding areas.

FIGS. 1A and 1B illustrate that the folding axis FX is parallel to the minor axis of the electronic device 1000 as an example, but the disclosure is not limited thereto. For example, the folding axis FX may extend along the major axis of the electronic device 1000, for example, in a direction parallel to the first direction DR1. The first area 1000A1, the second area 1000A2, and the third area 1000A3 may be sequentially arranged in the second direction DR2.

Sensing areas 100SA1, 100SA2, and 100SA3 may be defined in the electronic device 1000. FIG. 1A illustrate, as an example, three sensing areas 100SA1, 100SA2, and 100SA3, but the number of the sensing areas 100SA1, 100SA2, and 100SA3 is not limited thereto.

The sensing areas 100SA1, 100SA2, and 100SA3 may include the first sensing area 100SA1, the second sensing area 100SA2, and the third sensing area 100SA3. For example, the first sensing area 100SA1 may overlap a camera module, and the second sensing area 100SA2 and the third sensing area 100SA3 may overlap a proximity illuminance sensor, but the disclosure is not limited thereto.

Each of electronic modules may receive an external input transmitted through the first sensing area 100SA1, the second sensing area 100SA2, or the third sensing area 100SA3 and may provide an output through the first sensing area 100SA1, the second sensing area 100SA2, or the third sensing area 100SA3.

The first sensing area 100SA1 may be surrounded by the active area 1000A, and the second sensing area 100SA2 and the third sensing area 100SA3 may be included in the active area 1000A. For example, the second sensing area 100SA2 and the third sensing area 100SA3 may display an image. The transmittance of each of the first sensing area 100SA1, the second sensing area 100SA2, and the third sensing area 100SA3 may be higher than that of the active area 1000A. Further, the transmittance of the first sensing area 100SA1 may be higher than that of the second sensing area 100SA2 and that of the third sensing area 100SA3, respectively.

According to an embodiment, some of the electronic modules may overlap the active area 1000A, and others thereof may be surrounded by the active area 1000A. Accordingly, it is not necessary to provide a region, in which the electronic modules are to be disposed, in a peripheral area 1000NA surrounding the active area 1000A. As a result, an area ratio of the active area 1000A to an entire area of the electronic device 1000 may be increased.

FIGS. 2A to 2D are schematic cross-sectional views of an electronic device according to an embodiment. FIGS. 2A to 2D are schematic cross-sectional views of the electronic device taken along line I-I' of FIG. 1A. FIG. 3 is a schematic cross-sectional view of a display panel according to an embodiment.

Figure 2A:
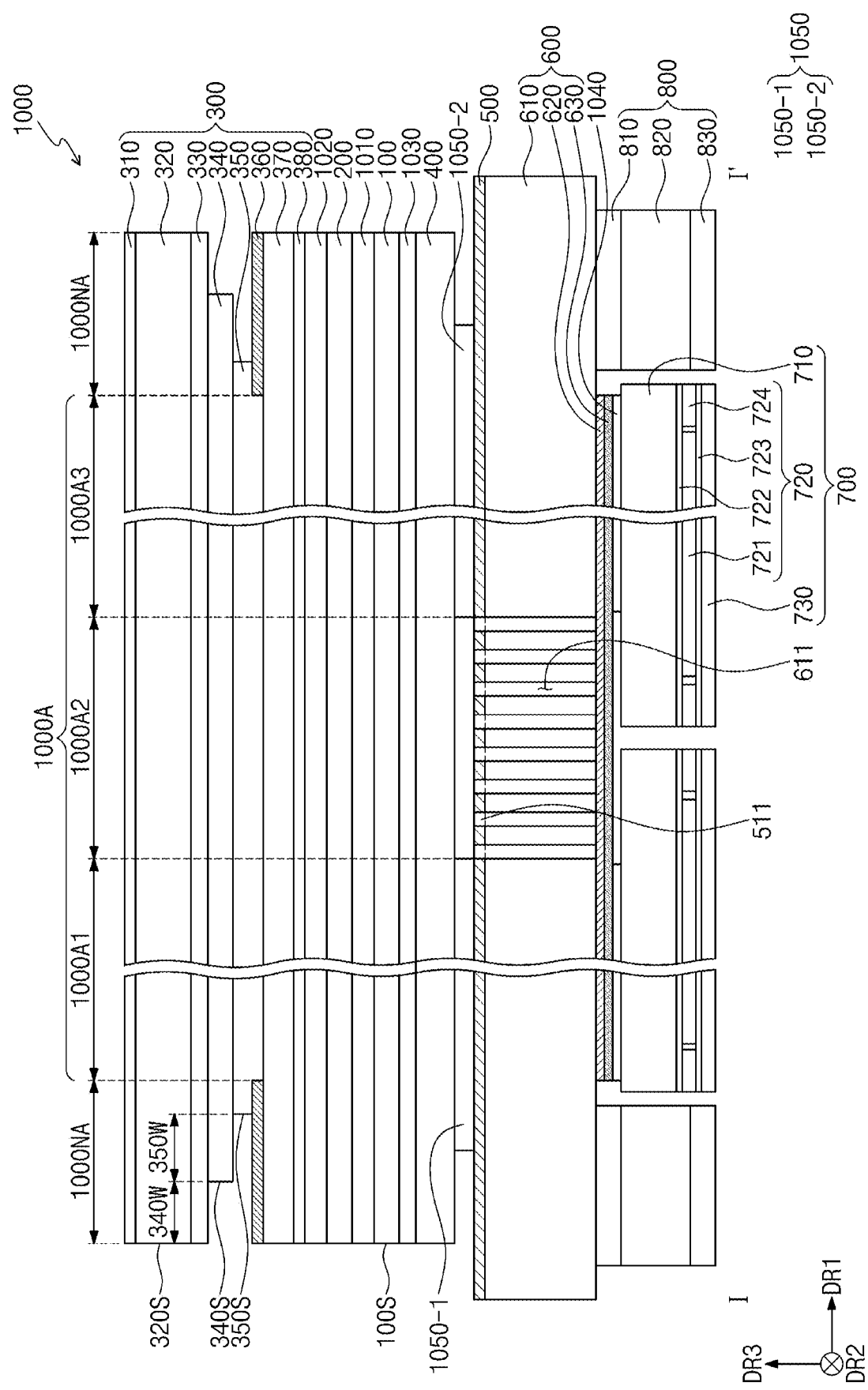
FIGS. 2A to 2D are schematic cross-sectional views of an electronic device according to an embodiment of the disclosure.
Figure 3:
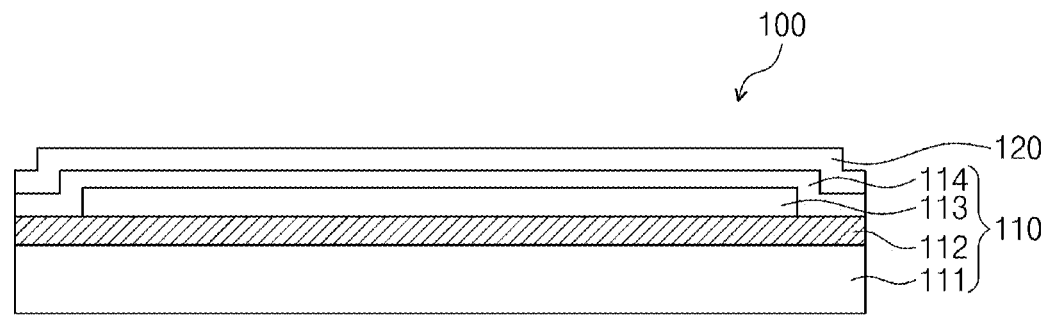
FIG. 3 is a schematic cross-sectional view of a display panel according to an embodiment of the disclosure.
Figure 3:
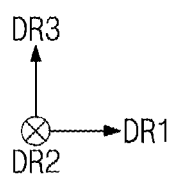

Referring to FIG. 2A, the electronic device 1000 may include a display panel 100, upper functional layers, and lower functional layers.

Referring to FIG. 3, the display panel 100 may be configured to generate an image and to sense an input applied from the outside. For example, the display panel 100 may include a display layer 110 and a sensor layer 120. A thickness of the display panel 100 may be about 25 micrometers to about 35 micrometers, for example, 30 micrometers, and the thickness of the display panel 100 is not limited thereto.

The display layer 110 may be a configuration to actually generate the image. The display layer 110 may be an emissive display layer, and for example, the display layer 110 may be an organic light emitting display layer, a quantum dot display layer, or a micro LED display layer.

The display layer 110 may include a base layer 111, a circuit layer 112, a light emitting element layer 113, and an encapsulation layer 114.

The base layer 111 may include a synthetic resin film. The synthetic resin film may include a thermosetting resin. The base layer 111 may have a multilayer structure. For example, the base layer 111 may have a three-layer structure of a synthetic resin film, an adhesive layer, and a synthetic resin film. In particular, the synthetic resin film may be a polyimide resin layer, and a material thereof is not limited. The synthetic resin film may include at least one of an acrylic resin, a methacrylic resin, a polyisoprene, a vinyl resin, an epoxy resin, a urethane resin, a cellulose resin, a siloxane resin, a polyamide resin, and a perylene resin. Besides, the base layer 111 may include a glass substrate or an organic/inorganic composite material substrate.

The circuit layer 112 may be disposed on the base layer 111. The circuit layer 112 may include an insulating layer, a semiconductor pattern, a conductive pattern, and a signal line. The insulating layer, a semiconductor layer, and a conductive layer may be formed on the base layer 111 by a method such as coating or vapor deposition, and thereafter, the insulating layer, the semiconductor layer, and the conductive layer may be selectively patterned by photolithography processes. Then, the semiconductor pattern, the conductive pattern, and the signal line included in the circuit layer 112 may be formed.

The light emitting element layer 113 may be disposed on the circuit layer 112. The light emitting element layer 113 may include a light emitting element. For example, the light emitting element layer 113 may include an organic light emitting material, a quantum dot, a quantum rod, or a micro LED.

The encapsulation layer 114 may be disposed on the light emitting element layer 113. The encapsulation layer 114 may include an inorganic layer, an organic layer, and an inorganic layer sequentially stacked, but layers constituting the encapsulation layer 114 are not limited thereto.

The inorganic layers may protect the light emitting element layer 113 from moisture and oxygen, and the organic layer may protect the light emitting element layer 113 from foreign substances such as dust particles. The inorganic layers may include a silicon nitride layer, a silicon oxynitride layer, a silicon oxide layer, a titanium oxide layer, or an aluminum oxide layer. The organic layer may include an acrylic organic layer, but the disclosure is not limited thereto.

The sensor layer 120 may be disposed on the display layer 110. The sensor layer 120 may detect an external input applied from the outside. The external input may be an input of a user. The input of the user may include various types of external inputs such as a body part of the user, light, heat, pen, or pressure.

The sensor layer 120 may be formed on the display layer 110 by a continuous process. For example, the sensor layer 120 may be directly disposed on the display layer 110. Being directly disposed may mean that a third component is not disposed between the sensor layer 120 and the display layer 110. For example, an additional adhesive member may not be disposed between the sensor layer 120 and the display layer 110.

As another example, the sensor layer 120 may be coupled (or connected or bonded) to the display layer 110 by an adhesive member. The adhesive member may include a general adhesive or a pressure sensitive adhesive.

Referring back to FIG. 2A, the upper functional layers may be disposed on the display panel 100. For example, the upper functional layers may include an antireflection member 200 and an upper member 300.

The antireflection member 200 may be referred to as an antireflection layer. The antireflection member 200 may reduce a reflectance of external light incident from the outside. The antireflection member 200 may include a stretchable synthetic resin film For example, the antireflection member 200 may be provided such that a polyvinyl alcohol (PVA) film is dyed with an iodine compound. However, this is just an embodiment, and a material constituting the antireflection member 200 is not limited thereto. A thickness of the antireflection member 200 may be about 25 micrometers to about 35 micrometers, for example, about 31 micrometers, and the thickness of the antireflection member 200 is not limited thereto.

The antireflection member 200 according to an embodiment may include color filters. The color filters may have an arrangement. In the antireflection member 200, an arrangement of the color filters may be determined in consideration of emission colors of pixels included in the display layer 110. The antireflection layer may further include a black matrix adjacent to the color filters.

The antireflection member 200 according to an embodiment may include a destructive interference structure. For example, the destructive interference structure may include a first reflective layer and a second reflective layer disposed in different layers. First reflected light reflected from the first reflective layer and second reflected light reflected from the second reflective layer may destructively interfere with each other, and thus the reflectance of the external light may decrease.

The antireflection member 200 may be coupled to the display panel 100 by a first adhesive layer 1010. The first adhesive layer 1010 may be a transparent adhesive layer such as a PSA (pressure sensitive adhesive) film, an OCA (optically clear adhesive) film, or an OCR (optically clear adhesive resin). The adhesive layer described below may include a general adhesive or a pressure sensitive adhesive. A thickness of the first adhesive layer 1010 may be about 20 micrometers to about 30 micrometers, for example, about 25 micrometers, and the thickness of the first adhesive layer 1010 is not limited thereto.

In an embodiment, the first adhesive layer 1010 may be omitted, and the antireflection member 200 may be directly disposed on the display panel 100. An additional adhesive layer may not be disposed between the antireflection member 200 and the display panel 100.

The upper member 300 may be disposed on the antireflection member 200. The upper member 300 may include a first hard coating layer 310, a protective layer 320, a first upper adhesive layer 330, a window 340, a second upper adhesive layer 350, a black matrix 360, an impact absorbing layer 370, and a second hard coating layer 380. The components included in the upper member 300 are not limited to the above-described components. At least some of the above-described components may be omitted, and other components may be added.

The first hard coating layer 310 may be a layer disposed on the outermost surface of the electronic device 1000. The first hard coating layer 310 may be a functional layer for improving characteristics of the electronic device 1000 and may be coated on the protective layer 320 to be provided. For example, the first hard coating layer 310 may improve anti-fingerprint characteristics, anti-pollution characteristics, and anti-scratch characteristics.

The protective layer 320 may be disposed under the first hard coating layer 310. The protective layer 320 may protect components disposed below the protective layer 320. The protective layer 320 may be additionally provided with the first hard coating layer 310 and an anti-fingerprint layer to improve characteristics such as chemical resistance and abrasion resistance. The protective layer 320 may include a film having an elastic modulus of about 15 GPa or less at room temperature. A thickness of the protective layer 320 may be about 50 micrometers to about 60 micrometers, for example, about 55 micrometers, but the thickness of the protective layer 320 is not limited thereto. In an embodiment, the protective layer 320 may be omitted. In an embodiment, the protective layer 320 may include three layers 321, 322, and 323.

The first upper adhesive layer 330 may be disposed under the protective layer 320. The protective layer 320 and the window 340 may be coupled to each other by the first upper adhesive layer 330. A thickness of the first upper adhesive layer 330 may be about 20 micrometers to about 30 micrometers, for example, about 25 micrometers, but the thickness of the first upper adhesive layer 330 is not limited thereto.

The window 340 may be disposed under the first upper adhesive layer 330. The window 340 may include an optically transparent insulating material. For example, the window 340 may include a glass substrate or a synthetic resin film In case that the window 340 is a glass substrate, a thickness of the window 340 may be about 80 micrometers or less, for example, about 30 micrometers, but the thickness of the window 340 is not limited thereto.

In case that the window 340 is a synthetic resin film, the window 340 may include a PI (polyimide) film or a PET (polyethylene terephthalate) film.

The window 340 may have a multi-layer structure or a single-layer structure. For example, the window 340 may include synthetic resin films coupled to each other by an adhesive, or may include a glass substrate and a synthetic resin film coupled to each other by an adhesive.

The second upper adhesive layer 350 may be disposed under the window 340. The window 340 and the impact absorbing layer 370 may be coupled to each other by the second upper adhesive layer 350. A thickness of the second upper adhesive layer 350 may be about 30 micrometers to about 40 micrometers, for example, about 35 micrometers, but the thickness of the second upper adhesive layer 350 is not limited thereto.

In an embodiment, a sidewall 340S of the window 340 and a sidewall 350S of the second upper adhesive layer 350 may be disposed inside (or inward of) sidewalls of other layers, for example, a sidewall 100S of the display panel 100 and a sidewall 320S of the protective layer 320. The phrase "being disposed inside" may mean that a component is closer to the active area 1000A than to a reference component.

By the folding operation of the electronic device 1000, a positional relationship between the layers may be changed. In an embodiment, because the sidewall 340S of the window 340 is disposed inside the sidewall 100S of the display panel 100 and the sidewall 320S of the protective layer 320, even in case that the positional relationship between the layers is changed, a probability that the sidewall 340S of the window 340 protrudes from the sidewall 320S of the protective layer 320 may decrease. Accordingly, a probability that an external impact is transmitted through the sidewall 340S of the window 340 may decrease. As a result, a probability that a crack occurs in the window 340 may decrease.

A first distance 340W between the sidewall 340S of the window 340 and the sidewall 320S of the protective layer 320 may be greater than or equal to a given distance. Here, the first distance 340W may mean a distance in a direction parallel to the first direction DR1. The first distance 340W may correspond to a distance between the sidewall 340S and the sidewall 320S in a plan view.

The first distance 340W may be, but is not limited to, about 180 micrometers to about 205 micrometers, for example, about 196 micrometers. For example, the first distance 340W may be about 50 micrometers or more, or about 300 micrometers. As the first distance 340W becomes greater, the protective layer 320 may protrude more than the window 340, and a part of the protective layer 320 may be bent and may be attached to other components, for example, a case. As the area of the protective layer 320 becomes greater, a probability that foreign substances introduced from an upper part of the protective layer 320 are to be introduced into a lower part of the protective layer 320 may decrease.

The window 340 and the second upper adhesive layer 350 may be adhered (or bonded) to the impact absorbing layer 370 by a lamination process. In consideration of lamination process tolerance, the area of the window 340 and the area of the second upper adhesive layer 350 may be smaller than the area of the impact absorbing layer 370, respectively. The area of the second upper adhesive layer 350 may be smaller than the area of the window 340. For example, in a process of attaching the window 340, pressure may be applied to the second upper adhesive layer 350. The second upper adhesive layer 350 may be pressurized to be stretched in directions parallel to the first direction DR1 and the second direction DR2. The area of the second upper adhesive layer 350 may be smaller than the area of the window 340 such that the second upper adhesive layer 350 does not protrude more than the window 340.

In case that the first upper adhesive layer 330 and the second upper adhesive layer 350 are attached, buckling may occur in the window 340 because the window 340 could not be slipped during the folding operation of the electronic device 1000. However, in the embodiment, the area of the second upper adhesive layer 350 may be smaller than the area of the window 340. Accordingly, the first upper adhesive layer 330 may not be attached to the second upper adhesive layer 350, and a probability that foreign substances stick to the second upper adhesive layer 350 may decrease.

A second distance 350W between the sidewall 350S of the second upper adhesive layer 350 and the sidewall 320S of the protective layer 320 may be greater than or equal to a given distance. Here, the second distance 350W may mean a distance in a direction parallel to the first direction DR1. The second distance 350W may correspond to a distance between the sidewall 350S and the sidewall 320S in a plan view.

The second distance 350W may be about 392 micrometers, but the disclosure is not limited thereto. For example, the second distance 350W may be selected from a range between about 292 micrometers and about 492 micrometers, but the disclosure is not limited thereto. The black matrix 360 may be disposed between the impact absorbing layer 370 and the second upper adhesive layer 350. The black matrix 360 may be printed on an upper surface of the impact absorbing layer 370 to be provided. The black matrix 360 may overlap the peripheral area 1000NA. The black matrix 360 may be a colored layer and may be formed by a coating method. The black matrix 360 may include a colored organic material or an opaque metal, and a material constituting the black matrix 360 is not limited thereto.

FIG. 2A illustrates that the black matrix 360 is disposed on the upper surface of the impact absorbing layer 370, as an example, but a position of the black matrix 360 is not limited thereto. For example, the black matrix 360 may be provided on an upper surface of the protective layer 320, a lower surface of the protective layer 320, an upper surface of the window 340, or a lower surface of the window 340. The black matrix 360 may be provided as layers. A part of the black matrix 360 may be provided on the upper surface of the impact absorbing layer 370, and another part of the black matrix 360 may be provided on the upper surface of the protective layer 320, the lower surface of the protective layer 320, and the upper surface of the window 340, or the lower surface of the window 340.

The impact absorbing layer 370 may be a functional layer for protecting the display panel 100 from an external impact. The impact absorbing layer 370 may be selected from films having an elastic modulus of about 1 GPa or more at room temperature. The impact absorbing layer 370 may be a stretched film having an optical function. For example, the impact absorbing layer 370 may be an optical axis control film. A thickness of the impact absorbing layer 370 may be about 35 micrometers to about 45 micrometers, for example, about 41 micrometers, but the thickness of the impact absorbing layer 370 is not limited thereto. In an embodiment, the impact absorbing layer 370 may be omitted.

In case that the impact absorbing layer 370 is omitted, the antireflection member 200 may be adhered to the window 340 by an adhesive layer. The antireflection member 200 may contact a lower surface of a second adhesive layer 1020, and the window 340 may contact an upper surface of the second adhesive layer 1020. In case that the impact absorbing layer 370 is omitted, the black matrix 360 may be disposed on the upper surface of the protective layer 320, the lower surface of the protective layer 320, the upper surface of the window 340, or the lower surface of the window 340.

The second hard coating layer 380 may be provided on a surface of the impact absorbing layer 370. The impact absorbing layer 370 may have a curved surface. The upper surface of the impact absorbing layer 370 may contact the second upper adhesive layer 350. Accordingly, a curved part of the upper surface of the impact absorbing layer 370 may be filled with the second upper adhesive layer 350. Accordingly, an optical issue may not occur on the upper surface of the impact absorbing layer 370. A lower surface of the impact absorbing layer 370 may be planarized by the second hard coating layer 380. For example, in case that a first hole is cut to the second adhesive layer 1020 to be provided, a surface exposed by the first hole may have a smooth surface. Accordingly, as the second hard coating layer 380 covers an uneven surface of the impact absorbing layer 370, a haze that may occur on the uneven surface may be prevented.

The upper member 300 may be coupled to the antireflection member 200 by the second adhesive layer 1020. The second adhesive layer 1020 may include a general adhesive or a pressure sensitive adhesive. A thickness of the second adhesive layer 1020 may be about 20 micrometers to about 30 micrometers, for example, about 25 micrometers, and the thickness of the second adhesive layer 1020 is not limited thereto.

The lower functional layers may be disposed under the display panel 100. For example, the lower functional layers may include a lower protective film 400, a light shielding layer 500, a first lower member 600, second lower members 700, and a step compensation member 800. The components included in the lower functional layers are not limited to the above-described components. At least some of the above-described components may be omitted, and other components may be added.

The lower protective film 400 may be coupled to the rear surface of the display panel 100 by a third adhesive layer 1030. The lower protective film 400 may prevent scratches from occurring on a rear surface of the display panel 100 during a process of manufacturing the display panel 100. The lower protective film 400 may be a colored polyimide film For example, the lower protective film 400 may be an opaque yellow film, but the disclosure is not limited thereto.

A thickness of the lower protective film 400 may be about 40 micrometers to about 80 micrometers, and for example, may be about 68 micrometers. A thickness of the third adhesive layer 1030 may be about 13 micrometers to about 25 micrometers, for example, about 18 micrometers. However, the thickness of the lower protective film 400 and the thickness of the third adhesive layer 1030 are not limited thereto.

The light shielding layer 500 may be disposed under the lower protective film 400 and be disposed above the first lower member 600 to be described below.

The light shielding layer 500 may be a light shielding coating layer coated on an upper surface of the first lower member 600. The light shielding layer 500 may contact the upper surface of the first lower member 600. The first lower member 600 may include a plate 610 including a metal, and the light shielding layer 500 may contact an upper surface of the plate 610.

The light shielding layer 500 may include a light shielding material that absorbs light, more specifically, a black material, and may perform a function of preventing external light from being reflected by the first lower member 600 disposed under the light shielding layer 500. The light shielding layer 500 may include, for example, a black dye or a black pigment. In an embodiment, the light shielding layer 500 may include carbon black as the black pigment. The light shielding layer 500 may be formed by coating the upper surface of the plate 610 with black ink including a light shielding material.

In an embodiment, the light shielding layer 500 may include a polymer resin, which is a medium in which a black pigment such as carbon black is dispersed. The light shielding layer 500 may include carbon black dispersed in a polymer material such as an acrylic resin, a melamine resin, or an epoxy resin. The light shielding layer 500 may further include cellulose acetate butyrate as the polymer material. The light shielding layer 500 may be a single film formed of a polymer resin in which carbon black is dispersed.

FIG. 2A illustrates the light shielding layer 500 is disposed on the upper surface of the plate 610, as an example, but the disclosure is not limited thereto, and the light shielding layer 500 may be disposed on a lower surface of the plate 610. In an embodiment, the light shielding layers 500 may be disposed on both the upper and lower surfaces of the plate 610. The upper and lower surfaces of the plate 610 may be coated with black ink including a light shielding material, and thus the light shielding layer 500 may be formed.

The light shielding layer 500 may be adhered to the lower protective film 400 by an additional adhesive layer 1050. The additional adhesive layer 1050 may be disposed between the light shielding layer 500 and the lower protective film 400, and thus the light shielding layer 500 and the lower protective film 400 may be coupled to each other. The light shielding layer 500 may be directly attached to the lower protective film 400 by the additional adhesive layer 1050. In the disclosure, the phrase "directly attached" or "directly bonded" may mean that a part such as a layer, a film, a region, a plate, or the like, is coupled or bonded to another part with only an adhesive layer interposed therebetween, without a component therebetween. For example, the phrase "directly attached" or "directly bonded" may mean that two layers or two members are coupled or bonded to each other by an adhesive layer disposed therebetween. The light shielding layer 500 may contact a lower surface of the additional adhesive layer 1050, and the lower protective film 400 may contact an upper surface of the additional adhesive layer 1050.

In an embodiment, the additional adhesive layer 1050 may not be disposed in a region of the plate 610 in which openings 611 are defined. For example, the additional adhesive layer 1050 may include a first additional adhesive layer 1050-1 and a second additional adhesive layer 1050-2, and the first additional adhesive layer 1050-1 and the second additional adhesive layer 1050-2 may be spaced from each other with the region, in which the openings 611 are defined, therebetween.

A thickness of the light shielding layer 500 may be about 7 micrometers or more and about 13 micrometers or less. The thickness of the light shielding layer 500 may also be about 8 micrometers or more and about 12 micrometers or less. In case that the thickness of the light shielding layer 500 is about 7 micrometers or less, the light shielding characteristics of the light shielding layer 500 may decrease, and the durability of the light shielding layer 500 coated on the first lower member 600 may decrease. In case that the thickness of the light shielding layer 500 is greater than about 13 micrometers, folding characteristics of the electronic device 1000 may be degraded by the light shielding layer 500 formed thickly on the first lower member 600, and film-forming characteristics of the light shielding layer 500 may be deteriorated.

The first lower member 600 may be disposed under the light shielding layer 500. The light shielding layer 500 may be coated on the first lower member 600, and thus the light shielding layer 500 and the first lower member 600 may contact each other. The light shielding layer 500 may contact the upper surface of the plate 610 included in the first lower member 600. The first lower member 600 may support components disposed thereon. Some components of the first lower member 600 may be referred to as support members. In an embodiment, the plate 610 included in the first lower member 600 may be referred to as a support member.

The first lower member 600 includes the plate 610, an adhesive layer 620, and a cover layer 630. The components included in the first lower member 600 are not limited to the above-described components, and other components may be added.

The plate 610 may include a material having an elastic modulus of about 60 GPa or more at room temperature. The plate 610 may include a metal. The plate 610 may include a single metal material or an alloy of metal materials. For example, the plate 610 may be SUS304, but is not limited thereto. The plate 610 may support components disposed thereon. The plate 610 may improve the heat dissipation performance of the electronic device 1000.

The openings 611 may be defined in a part of the plate 610. The openings 611 may be defined in a region overlapping the second area 1000A2. In a plan view, for example, when viewed in the third direction DR3, the openings 611 may overlap the second area 1000A2. The openings 611 may allow a shape of the part of the plate 610 to be easily deformed. FIG. 2A illustrates that openings 611 are defined in the part of the plate 610 as an example, but the disclosure is not limited thereto, and the openings 611 may be defined in the entire region overlapping the second area 1000A2 in a shape of a gap.

The cover layer 630 may be attached to the plate 610 by the adhesive layer 620. An upper surface of the adhesive layer 620 may contact the lower surface of the plate 610, and a lower surface of the adhesive layer 620 may contact an upper surface of the cover layer 630. Unlike illustrated in FIG. 2A, the adhesive layer 620 may not be disposed in the region of the plate 610 overlapping the second area 1000A2. The cover layer 630 may cover (or overlap) the openings 611 of the plate 610. Therefore, it is possible to additionally prevent foreign substances from being introduced into the openings 611. Each of the cover layer 630 and the adhesive layer 620 includes a light shielding material.

The cover layer 630 may include a cover base material and a light shielding material. The cover layer 630 may be a cover base material and include a material having an elastic modulus lower than that of the plate 610. The cover layer 630 may be a flexible film. The cover layer 630 may include a material having an elastic modulus of about 30 Mpa or less and an elongation of about 100% or more. For example, the cover layer 630 may include at least one of an acrylic resin, a methacrylic resin, polyisoprene, a vinyl resin, an epoxy resin, a urethane resin, a cellulose resin, a siloxane resin, a polyimide resin, a polyamide resin, and a perylene resin. For example, the cover layer 630 may include thermoplastic polyurethane. The cover layer 630 may be a thermoplastic polyurethane film having a mesh pattern formed thereon.

The cover layer 630 may include, for example, a black dye or a black pigment, as the light shielding material. The cover layer 630 may include carbon black. The cover layer 630 may include reactive carbon black. The reactive carbon black included in the cover layer 630 may be chemically bonded to the cover base material. The cover layer 630 may include the light shielding material and the cover base material, and the light shielding material and the cover base material may be chemically bonded to each other. The cover layer 630 may include the light shielding material in an amount of about 1% or more and about 10% or less.

The adhesive layer 620 may include an adhesive base material and a light shielding material. The adhesive layer 620 may include, as the adhesive base material, a general adhesive or a pressure sensitive adhesive, as the adhesive base material. The adhesive layer 620 may include an acrylic resin as the adhesive base material. The adhesive layer 620 may include an adhesive material such as polyurethane, polyacryl, polyester, polyepoxy, polyvinyl acetate, or the like. The adhesive layer 620 may include an organic adhesive material such as a PSA (pressure sensitive adhesive). The adhesive layer 620 may include an optically transparent adhesive material.

The adhesive layer 620 may include, for example, a black dye or a black pigment as the light shielding material. The adhesive layer 620 may include carbon black. The adhesive layer 620 may include reactive carbon black. The reactive carbon black included in the adhesive layer 620 may be chemically bonded to the adhesive base material. The adhesive layer 620 may include the light shielding material and the adhesive base material, and the light shielding material and the adhesive base material may be chemically bonded to each other. The adhesive layer 620 may include the light shielding material in an amount of about 1% or more and about 10% or less.

The light shielding materials included in the cover layer 630 and the adhesive layer 620 and the light shielding material included in the above-described light shielding layer 500 may be different from each other. In an embodiment, each of the cover layer 630 and the adhesive layer 620 may include a first light shielding material, the light shielding layer 500 may include a second light shielding material, and the first light shielding material and the second light shielding material may be different to each other, but the disclosure is not limited thereto. The first light shielding material and the second light shielding material may be the same.

A thickness of the plate 610 may be about 120 micrometers to about 180 micrometers, for example, about 150 micrometers. A thickness of the adhesive layer 620 may be about 4 micrometers to about 15 micrometers, for example, about 8 micrometers. A thickness of the cover layer 630 may be about 4 micrometers to about 15 micrometers, for example, about 8 micrometers. However, the thickness of the plate 610, the thickness of the adhesive layer 620, and the thickness of the cover layer 630 are not limited to the above-described values.

The second lower members 700 may be disposed under the first lower member 600. The second lower members 700 may be spaced from each other. For example, a second lower member 700 may be disposed in the first area 1000A1 and another second lower member 700 may be disposed in the third area 1000A3. In the disclosure, the second lower members 700 may be referred to as lower support members.

Each of the second lower members 700 may be attached to the first lower member 600 by fourth adhesive layers 1040. For example, a fourth adhesive layer 1040 may be attached to a lower surface of the first lower member 600 overlapping the first area 1000A1, and another fourth adhesive layer 1040 may be attached to the lower surface of the first lower member 600 overlapping the third area 1000A3. For example, the fourth adhesive layers 1040 may not overlap the second area 1000A2. A thickness of each of the fourth adhesive layers 1040 may be about 8 micrometers to about 15 micrometers, for example, about 8 micrometers, but the thickness of each of the fourth adhesive layers 1040 is not limited thereto.

Although not shown in the accompanying drawings, a step compensation film 800 may be further disposed between each of the second lower members 700 and the first lower member 600. For example, the step compensation film 800 may be provided in a region overlapping the second area 1000A2. A surface of the step compensation film 800 may have adhesion lower than that of another surface of the step compensation film 800. For example, the surface may have no adhesion. The surface may be a surface facing the first lower member 600.

Each of the second lower members 700 may include a lower plate 710, a heat dissipation sheet 720, and an insulating film 730. The components included in each of the second lower members 700 are not limited to the above-described components. At least some of the above-described components may be omitted, and other components may be added.

Multiple lower plates 710 may be provided. One of the lower plates 710 may overlap the first area 1000A1 and a part of the second area 1000A2, and another lower plate 710 may overlap another part of the second area 1000A2 and the third area 1000A3.

The lower plates 710 may be spaced from each other in the second area 1000A2. However, the lower plates 710 may be disposed as close as possible, thereby supporting the region of the plate 610 in which the openings 611 are formed. For example, the lower plates 710 may prevent deformation of a shape of the region, in which the openings 611 of the plate 610 are defined, due to pressure applied from a top of the electronic device 1000.

The lower plates 710 may prevent shapes of the components, disposed on the second lower members 700, from being changed by the components disposed under the second lower members 700.

Each of the lower plates 710 may include a metal alloy, and for example, each of the lower plates 710 may include a copper alloy. However, the materials constituting (or forming) the lower plates 710 are not limited thereto. A thickness of each of the lower plates 710 may be about 60 micrometers to about 100 micrometers, for example, about 80 micrometers, and the thickness of each of the lower plates 710 is not limited thereto.

The heat dissipation sheet 720 may be attached under each of the lower plates 710. The heat dissipation sheet 720 may be a heat conductive sheet having high thermal conductivity. For example, the heat dissipation sheet 720 may include a heat dissipation layer 721, a first heat dissipation adhesive layer 722, a second heat dissipation adhesive layer 723, and a gap tape 724.

The gap tape 724 may be attached to the first heat dissipation adhesive layer 722 and the second heat dissipation adhesive layer 723 spaced from each other with the heat dissipation layer 721 interposed therebetween. The gap tape 724 may be formed of multiple layers. For example, the gap tape 724 may include a base layer, an upper adhesive layer disposed on an upper surface of the base layer, and a lower adhesive layer disposed on a lower surface of the base layer.

The heat dissipation layer 721 may be attached to the lower plate 710 by the first heat dissipation adhesive layer 722. The heat dissipation layer 721 may be sealed by the first heat dissipation adhesive layer 722, the second heat dissipation adhesive layer 723, and the gap tape 724. The heat dissipation layer 721 may be a graphitized polymer film. The polymer film may be, for example, a polyimide film. Each of the first heat dissipation adhesive layer 722 and the second heat dissipation adhesive layer 723 may have a thickness of about 3 micrometers to about 8 micrometers, and may be, for example, about 5 micrometers. Each of the heat dissipation layer 721 and the gap tape 724 may have a thickness of about 10 micrometers to about 25 micrometers, and may be, for example, about 17 micrometers. However, the thicknesses of the first heat dissipation adhesive layer 722, the second heat dissipation adhesive layer 723, the heat dissipation layer 721, and the gap tape 724 are not limited to the above-described values, respectively.

The insulating film 730 may be attached under the heat dissipation sheet 720. For example, the insulating film 730 may be attached to the second heat dissipation adhesive layer 723. The insulating film 730 may prevent rattling in the electronic device 1000. A thickness of the insulating film 730 may be about 15 micrometers, but the disclosure is not limited thereto.

The step compensation member 800 may be attached under the plate 610. For example, the adhesive layer 620 may be attached under a part of the plate 610, and the step compensation member 800 may be attached under another part of the plate 610.

The step compensation member 800 may include a first compensation adhesive layer 810, a step compensation film 820, and a second compensation adhesive layer 830. The first compensation adhesive layer 810 may be attached to the lower surface of the plate 610. The step compensation film 820 may be a synthetic resin film The second compensation adhesive layer 830 may be attached to a lower surface of the step compensation film 820 and a set (not shown).

Although not shown in the accompanying drawings, a cushion film including a cushion layer may be further disposed under the second lower member 700, the step compensation member 800, or the like.

An electronic device according to an embodiment may include the metal plate disposed under the window and the display panel to support the window and the display panel and may include the cover layer attached to the lower part of the metal plate through the adhesive layer. Both the cover layer and the adhesive layer disposed under the metal plate may include a light shielding material. Accordingly, the electronic device according to an embodiment may improve impact resistance against the external impact, may prevent the external foreign substances from being introduced, and may prevent display performance of the electronic device from being deteriorated by the light incident from a bottom of the electronic device.

In case that the cushion layer having compressibility such as a sponge or the like is provided between the existing protective film and the first lower member, and the cushion layer is compressed by external impact, the window and the display panel disposed thereon may be also compressed together, and thus defects such as cracking or warping may occur thereon. In case that the cushion layer is omitted to improve impact resistance, the configuration, such as the light shielding layer, included in the cushion layer may be omitted, and thus light transmitted through the cover layer or reflected by the cover layer may be introduced into the display panel. As a result, display performance of the electronic device may be lowered.

The electronic device according to an embodiment may allow the cushion layer between the protective film and the first lower member to be omitted or a position of the cushion layer to be moved, and, for example, may allow the cushion layer to be disposed under the second lower member or the like. In the electronic device of the disclosure, each of the cover layer disposed under the metal plate and the adhesive layer disposed between the cover layer and the metal plate to attach the cover layer and the metal plate to each other may include the light shielding material. Accordingly, the impact resistance of the electronic device against the external impact may be improved, compared to a case where the cushion layer having the compressibility is disposed between the first lower member and the display panel, and the external light incident on the display panel may be prevented by the cover layer and the adhesive layer including the light shielding material, and thus deterioration of the display performance of the electronic device may be prevented, and the display efficiency of the electronic device may be improved.

Figure 2B:
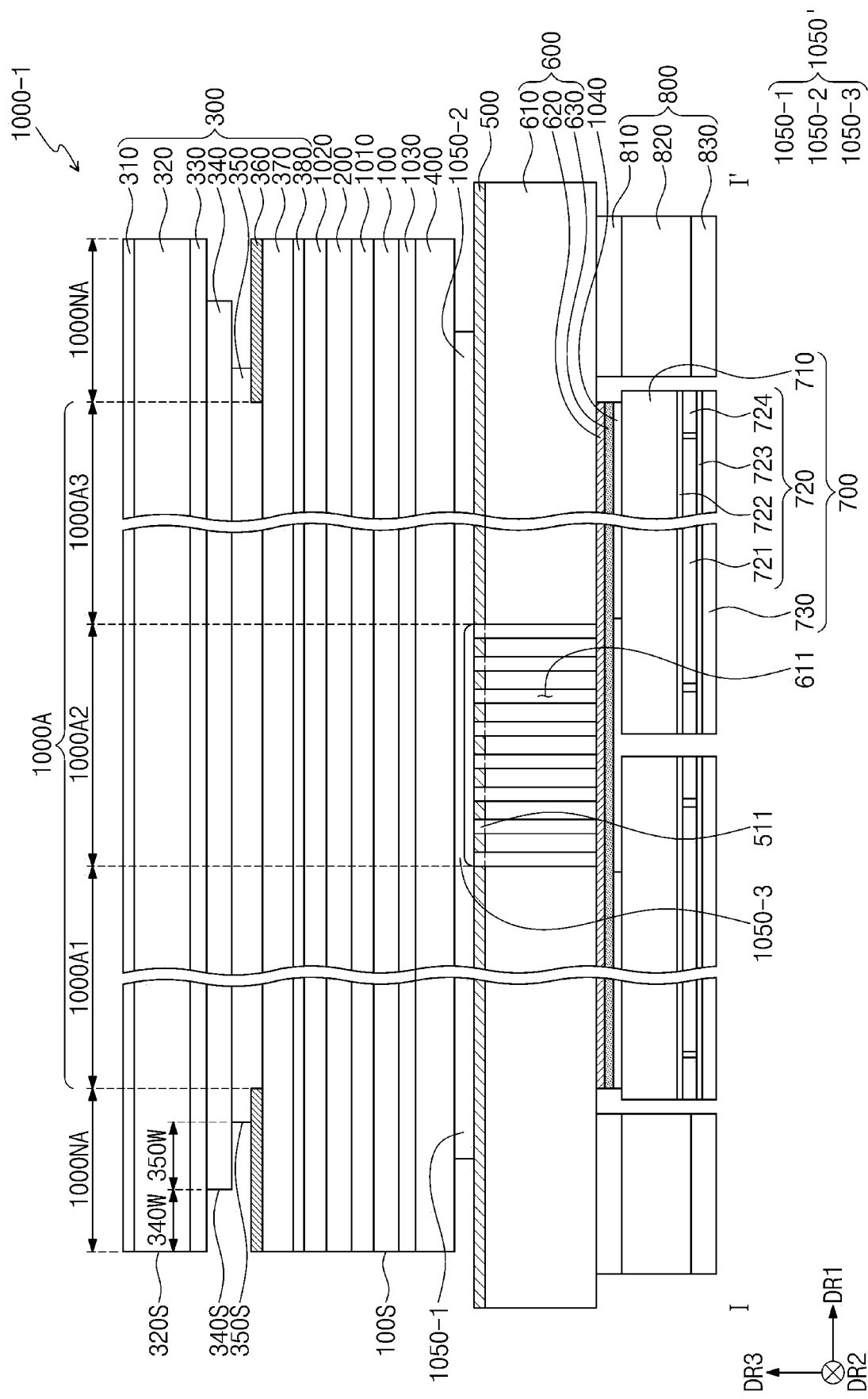

Referring to FIG. 2B, an electronic device 1000-1 according to an embodiment may include an additional adhesive layer 1050' disposed between the light shielding layer 500 and the lower protective film 400. The additional adhesive layer 1050' may be disposed between the light shielding layer 500 and the lower protective film 400, and thus the light shielding layer 500 and the lower protective film 400 may be coupled to each other. The light shielding layer 500 may contact a lower surface of the additional adhesive layer 1050', and the lower protective film 400 may contact an upper surface of the additional adhesive layer 1050'.

In an embodiment, the additional adhesive layer 1050' may include the first additional adhesive layer 1050-1 disposed on a part of the plate 610 overlapping the first area 1000A1, the second additional adhesive layer 1050-2 disposed on a part of the plate 610 overlapping the third area 1000A3, and a third additional adhesive layer 1050-3 disposed on a part of the plate 610 overlapping the second area 1000A2. The third additional adhesive layer 1050-3 may be disposed on the openings 611 of the plate 610. The third additional adhesive layer 1050-3 may have a shape curved upward not to contact the part where the openings 611 of the plate 610 are defined. As the third additional adhesive layer 1050-3 has the shape curved upward, the third additional adhesive layer 1050-3 may contact a lower surface of the lower protective film 400 and may not contact an upper surface of the light shielding layer 500. The first additional adhesive layer 1050-1, the third additional adhesive layer 1050-3, and the second additional adhesive layer 1050-2 may be integral with each other, and the first additional adhesive layer 1050-1, the third additional adhesive layer 1050-3, and the second additional adhesive layer 1050-2 may be sequentially extended.

Figure 2C:
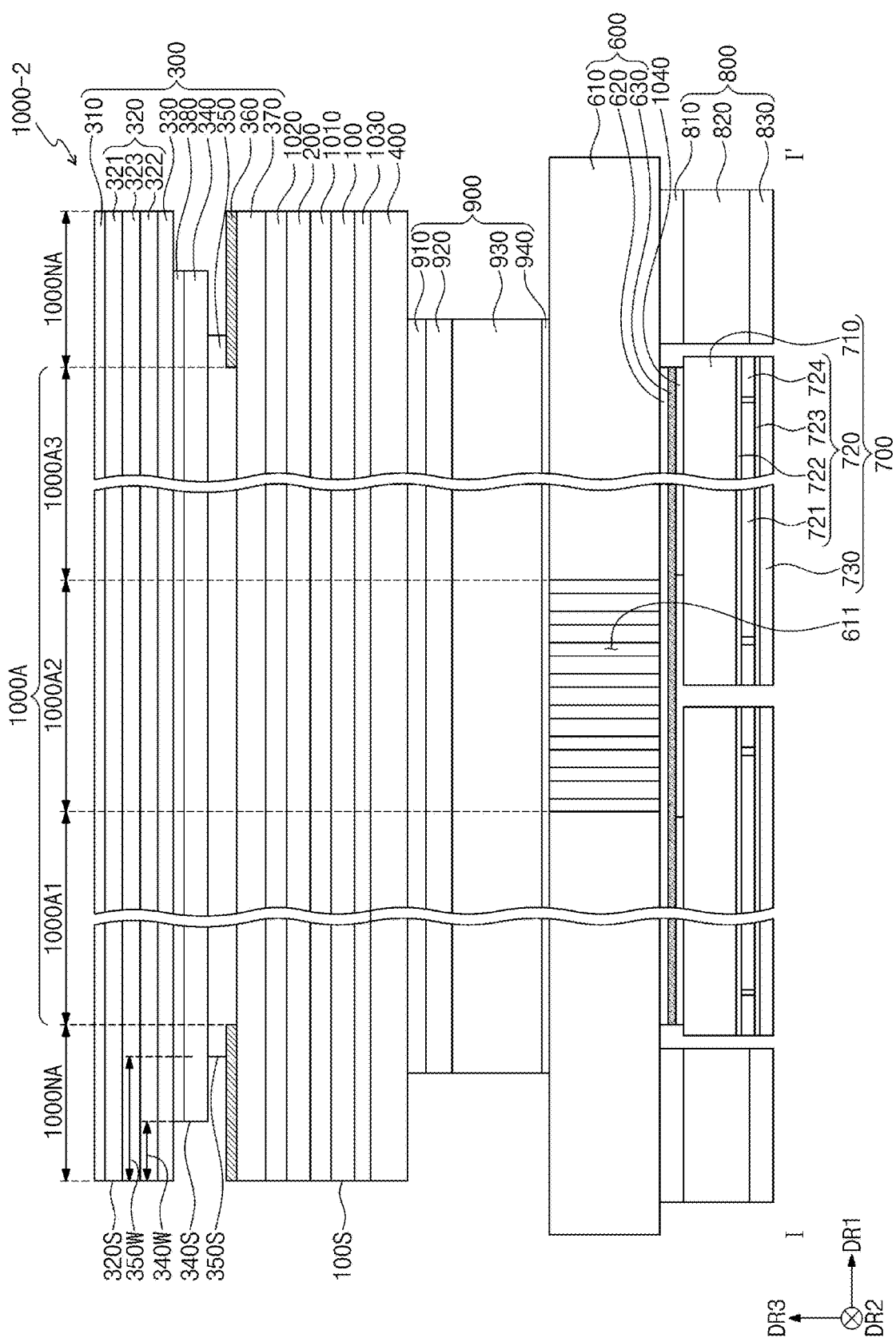

Referring to FIG. 2C, an electronic device 1000-2 according to an embodiment may include a cushion member 900 disposed between the display panel 100 and the first lower member 600. The cushion member 900 may be disposed under the display panel 100. The cushion member 900 may be disposed under the lower protective film 400. The cushion member 900 may protect the display panel 100 from an impact transmitted from a bottom of the electronic device 1000-2. The cushion member 900 may improve impact resistance of the electronic device 1000.

The cushion member 900 may include a barrier film 920, and a cushion layer 930. The cushion member 900 may further include a first cushion adhesive layer 910 and a second cushion adhesive layer 940. The components included in the cushion member 900 are not limited to the above-described components, and other components may be added besides the above-described components.

The first cushion adhesive layer 910 and the second cushion adhesive layer 940 may include a general adhesive or a pressure sensitive adhesive. The first cushion adhesive layer 910 may be attached to the lower protective film 400, and the second cushion adhesive layer 940 may be attached to the plate 610. A thickness of the first cushion adhesive layer 910 may be about 25 micrometers, and a thickness of the second cushion adhesive layer 940 may be about 8 micrometers. However, the thicknesses of the first cushion adhesive layer 910 and the second cushion adhesive layer 940 are not limited thereto.

The barrier film 920 may be a synthetic resin film, for example, a polyimide (PI) film, but the disclosure is not limited thereto. The barrier film 920 may include, for example, at least one of polyimide, PA (polyamide), polyetheretherketone, and PET (polyethylene terephthalate).

A thickness of the barrier film 920 may be about 8 micrometers or more and about 40 micrometers or less. For example, the thickness of the barrier film 920 may be about 20 micrometers.

The barrier film 920 may have a high modulus. The barrier film 920 may be provided to improve impact resistance performance of the electronic device 1000. The barrier film 920 may prevent deformation of the display panel 100, thereby improving the impact resistance of the display panel 100.

The cushion layer 930 may include a foam, a sponge, or the like. The cushion layer 930 may have elasticity and may have a porous structure.

The cushion layer 930 may include polyurethane or thermoplastic polyurethane, but the disclosure is not limited thereto. The cushion layer 930 may not be limited and may include various materials as long as they may absorb impact.

The cushion layer 930 may be formed using the barrier film 920 as a base layer. For example, the cushion layer 930 may be formed by applying a mixture including a polyurethane resin and a foaming agent on the barrier film 920, and then foaming the foaming agent. The cushion layer 930 may be directly disposed on a lower surface of the barrier film 920. The cushion layer 930 may contact the lower surface of the barrier film 920. As another example, the cushion layer 930 may be attached to the lower surface of the barrier film 920 by an adhesive member.

A thickness of the cushion layer 930 may be about 80 micrometers or more and about 120 micrometers or less. For example, the thickness of the cushion layer 930 may be about 100 micrometers.

The cushion member 900 may be attached to the upper surface of the first lower member 600 included in the lower support member by the second cushion adhesive layer 940. The cushion member 900 may be attached to the upper surface of the plate 610 by the second cushion adhesive layer 940.

Figure 2D:
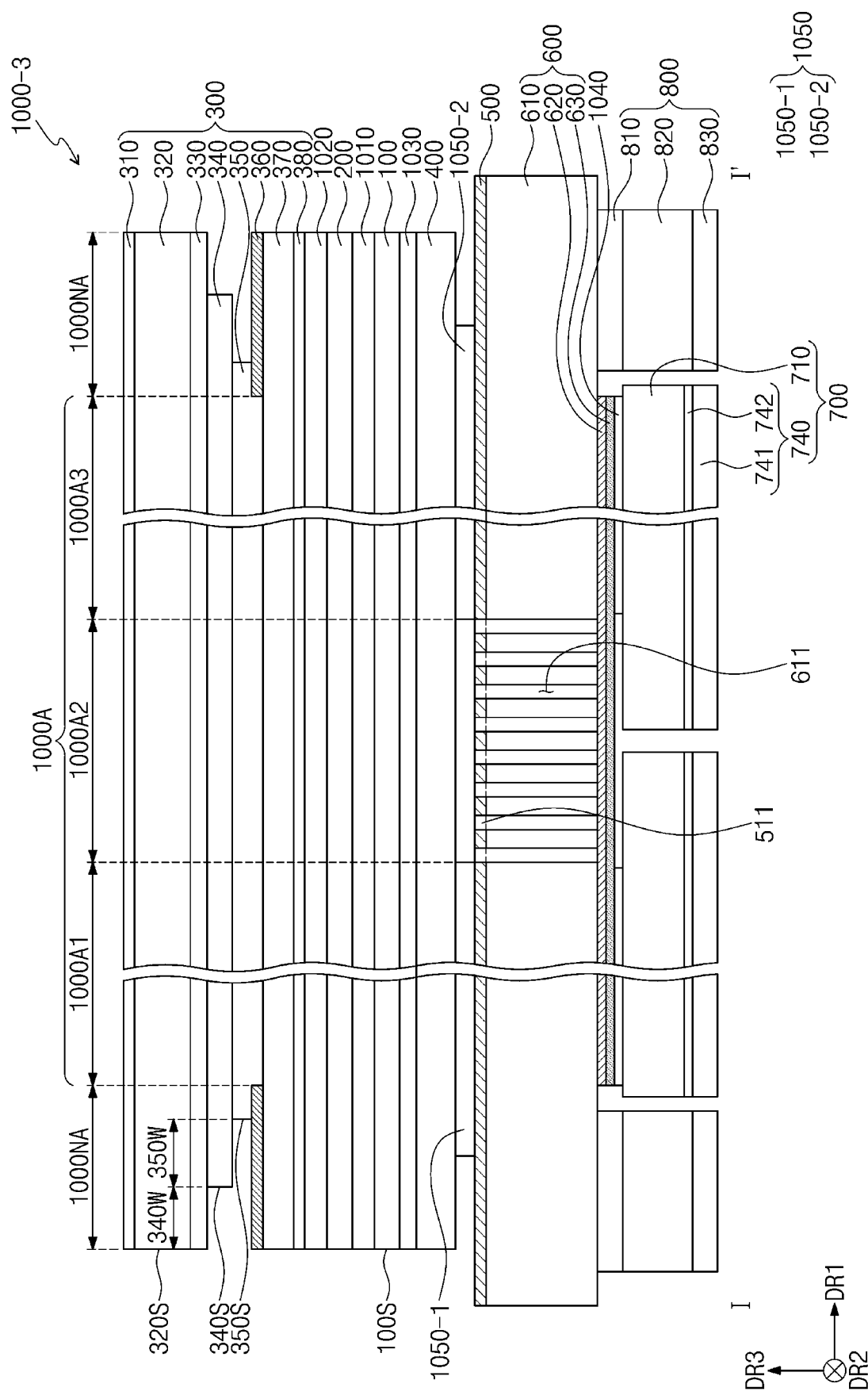

Referring to FIG. 2D, an electronic device 1000-3 according to an embodiment may include the second lower members 700, and each of the second lower members 700 may include the lower plate 710 and a lower cushion member 740.

The lower cushion member 740 may be attached under the lower plate 710. The lower cushion member 740 may include a lower cushion layer 741 and a lower cushion adhesive layer 742. The components included in the lower cushion member 740 are not limited to the above-described components, and other components may be added besides the above-described components.

The lower cushion adhesive layer 742 may include a general adhesive or a pressure sensitive adhesive. The lower cushion adhesive layer 742 may be attached between the lower plate 710 and the lower cushion layer 741. A thickness of the lower cushion adhesive layer 742 may be about 3 micrometers to about 8 micrometers, for example, about 5 micrometers. However, the thickness of the lower cushion adhesive layer 742 is not limited thereto.

The lower cushion layer 741 may include a foamed foam, a sponge, or the like. The cushion layer 930 may have elasticity and may have a porous structure.

The lower cushion layer 741 may include polyurethane or thermoplastic polyurethane, but the disclosure is not limited thereto. The lower cushion layer 741 may not be limited and may include various materials as long as they may absorb impact.

The lower cushion member 740 may further include a barrier film or the like as a base layer for forming the lower cushion layer 741. The lower cushion layer 741 may be formed by applying a mixture including a polyurethane resin and a foaming agent on the barrier film and then foaming the foaming agent.

Figure 4:
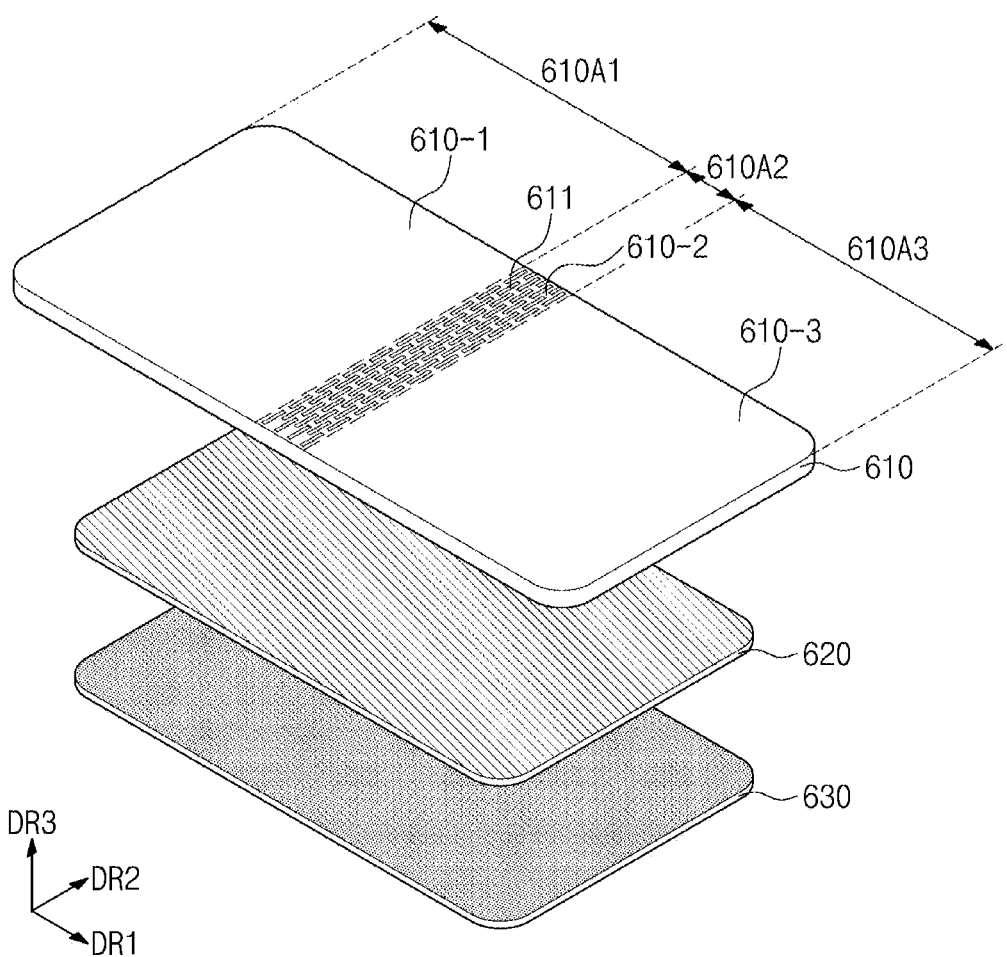
FIG. 4 is a schematic perspective view of some components included in an electronic device according to an embodiment of the disclosure.

FIG. 4 is a schematic perspective view of some components included in an electronic device according to an embodiment. FIG. 4 is a schematic exploded perspective view illustrating the plate 610 included in a first lower member, and the adhesive layer 620 and the cover layer 630 disposed under the plate 610 in an electronic device according to an embodiment.

Referring to FIGS. 2A to 2D and 4, the plate 610 included in the electronic device according to an embodiment may include a first non-folding area 610A1, a folding area 610A2, and a second non-folding area 610A3, which are arranged in the first direction DR1. The folding area 610A2 of the plate 610 may overlap the second area 1000A2 of the active area 1000A of the electronic device 1000. The first non-folding area 610A1 and the second non-folding area 610A3 of the plate 610 may be connected or extend to the folding area 610A2, at least a part of the first non-folding area 610A1 may overlap the first area 1000A1 of the active area 1000A of the electronic device 1000, and at least a part of the second non-folding area 610A3 may overlap the second area 1000A2 of the active area 1000A of the electronic device 1000. At least a part of the first non-folding area 610A1 and the second non-folding area 610A3 may overlap the peripheral area 1000NA of the electronic device 1000. The plate 610 may include a first part 610-1 overlapping the first non-folding area 610A1, a second part 610-2 overlapping the folding area 610A2, and a third part 610-3 overlapping the second non-folding area 610A3.

The openings 611 overlapping the folding area 610A2 may be defined in the plate 610. The openings 611 may overlap the second area 1000A2 of the active area 1000A of the electronic device 1000. The openings 611 may be provided in rows. The openings 611 may be provided in rows and may be arranged to be offset from one another. The openings 611 may be provided in rows and may be arranged in the shape of a diamond mesh. FIGS. 2A to 2D and 4 illustrate that the openings 611 are defined in the folding area 610A2 of the plate 610, but the disclosure is not limited thereto, and an opening may be defined in an entire region of the plate 610 overlapping the second area 1000A2 while having a gap shape. For example, the plate 610 may include the first part 610-1 corresponding to the first non-folding area 610A1 and the third part 610-3 corresponding to the second non-folding area 610A3, the second part 610-2 overlapping the folding area 610A2 may be omitted, and thus the first part 610-1 and the third part 610-3 may be spaced from each other by a given gap.

The cover layer 630 may overlap at least the folding area 610A2 of the plate 610 in a plan view. The cover layer 630 may overlap the second part 610-2 of the plate 610 in a plan view, thereby covering the openings 611 defined in the second part 610-2. Therefore, the cover layer 630 may prevent foreign substances from being introduced into the openings 611 defined in the plate 610.

The adhesive layer 620 may overlap at least the folding area 610A2 of the plate 610 in a plan view. The adhesive layer 620 may be completely overlapped by the cover layer 630 in a plan view, and the cover layer 630 may be attached to the lower surface of the plate 610. However, the adhesive layer 620 may be, but is not limited to, disposed to overlap only the first non-folding area 610A1 and the second non-folding area 610A3 and not to overlap the folding area 610A2 of the plate 610.

The light-blocking layer 500 may include light-blocking openings 511 in the second light-blocking portion 502. For example, light-blocking openings 511 may be defined in the second light-blocking portion 502 of the light-blocking layer 500. When viewed in a plan view, the light-blocking openings 511 may respectively overlap the openings 611 defined in the folding region 610A2 of the plate 610. In detail, the light-blocking openings 511 may be defined to have the same shape and arrangement of the openings 611. For example, the light-blocking openings 511 may be arranged to form rows which may be shifted from each other in an alternate manner. In the process of coating the top surface of the plate 610 with the light-blocking layer 500, the paint containing the light-blocking material may be coated on the remaining region of the plate 610, other than the opening 611, to form the light-blocking layer 500. Accordingly, the light-blocking opening 511 and the opening 611 may fully overlap each other.

Since the light-blocking openings 511 defined in the light-blocking layer 500 may fully overlap the openings 611 defined in the plate 610, the openings 611 defined in the plate 610 may not be covered with the light-blocking layer 500 and may remain open, when viewed in a plan view. Accordingly, a folding property of the folding region 610A2 of the plate 610 may not be deteriorated, and the shape of the folding region 610A2 may be more easily changed by the folding operation.

Figure 5A:
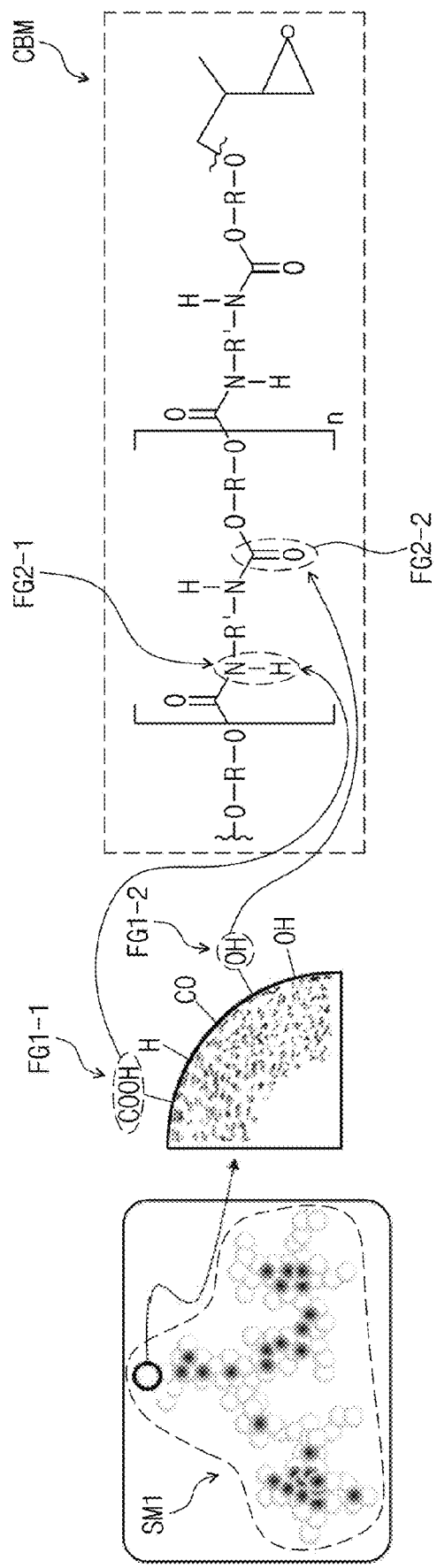
FIG. 5A schematically illustrates a bonding relationship between materials in a cover layer included in an electronic device according to an embodiment of the disclosure.
Figure 5B:
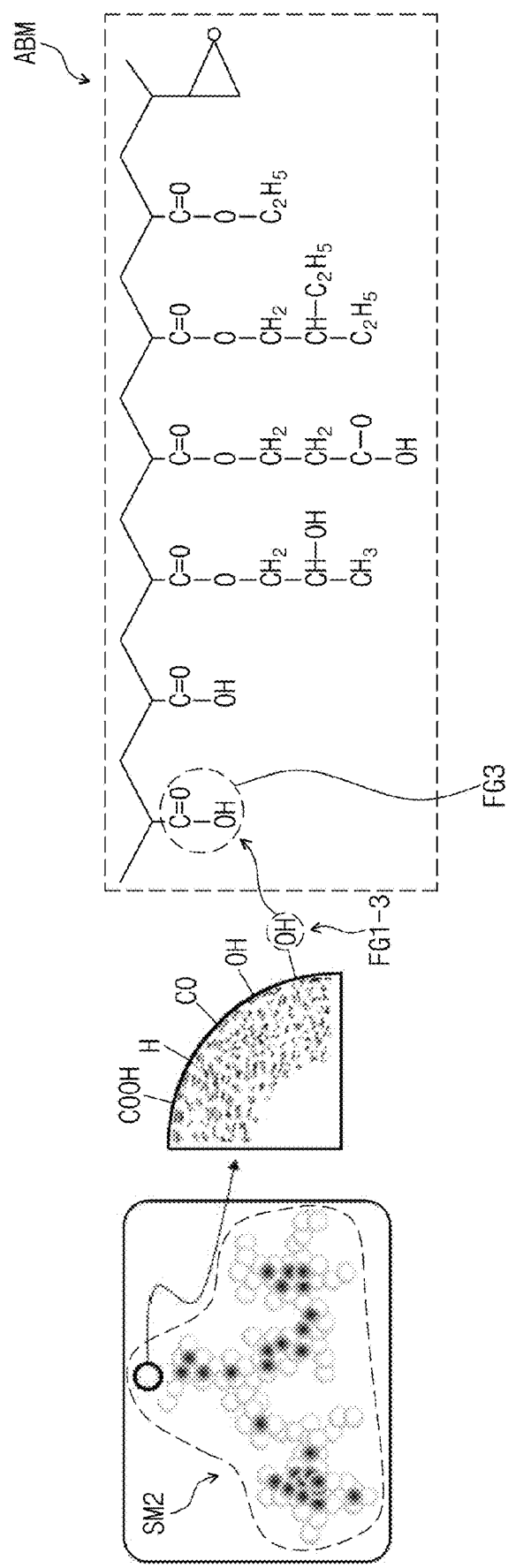
FIG. 5B schematically illustrates a bonding relationship between materials in an adhesive layer included in an electronic device according to an embodiment of the disclosure.

FIG. 5A schematically illustrates a bonding relationship between materials in a cover layer included in an electronic device according to an embodiment. FIG. 5B schematically illustrates a bonding relationship between materials in an adhesive layer included in an electronic device according to an embodiment.

Referring to FIGS. 2A, 4, and 5A, the cover layer 630 according to an embodiment may include a first light shielding material SM1 and a cover base material CBM.

The first light shielding material SM1 may include reactive carbon black. The first light shielding material SM1 may be a material including first functional groups FG1-1 and FG1-2. The first functional groups FG1-1 and FG1-2 may be, for example, a carboxyl group, a carbonyl group, an amide group, an ester group, a hydroxy group, or the like.

The cover base material CBM may include at least one of an acrylic resin, a methacrylic resin, polyisoprene, a vinyl resin, an epoxy resin, a urethane resin, a cellulose resin, a siloxane resin, a polyimide resin, a polyamide resin, and a perylene resin. For example, the cover base material CBM may include thermoplastic polyurethane.

The cover base material CBM may be a material including second functional groups FG2-1 and FG2-2. The second functional groups FG2-1 and FG2-2 may be, for example, a carboxyl group, a carbonyl group, an amide group, an ester group, an amine group, an epoxy group, a carbamic acid group, or the like.

In the cover layer 630, the first functional groups FG1-1 and FG1-2 may chemically bond to the second functional groups FG2-1 and FG2-2, respectively. Each of the first functional groups FG1-1 and FG1-2 may chemically bond to a corresponding one of the second functional groups FG2-1 and FG2-2. Each of the first functional groups FG1-1 and FG1-2 may be hydrogen-bonded or covalently bonded to each of the second functional groups FG2-1 and FG2-2. In the cover layer 630 according to the embodiment, the first functional groups FG1-1 and FG1-2 included in the first light shielding material SM1 and the second functional groups FG2-1 and FG2-2 included in the cover base material CBM may be chemically bonded. Therefore, the first light shielding material SM1 may be uniformly dispersed in the cover layer 630, and the first light shielding material SM1 may be stably included in the cover layer 630, and thus the light incident on the electronic device may be effectively blocked.

Referring to FIGS. 2A, 4, and 5B, the adhesive layer 620 according to an embodiment may include a second light shielding material SM2 and a cover base material CBM.

The second light shielding material SM2 may include reactive carbon black. The second light shielding material SM2 may be identical to the first light shielding material SM1 included in the cover layer 630. The second light shielding material SM2 may be a material including first functional groups FG1-3. The first functional groups FG1-3 may be, for example, a carboxyl group, a carbonyl group, an amide group, an ester group, a hydroxy group, or the like.

An adhesive base material ABM may include an acrylic resin. The adhesive base material ABM may include an adhesive material such as polyurethane, polyacryl, polyester, polyepoxy, polyvinyl acetate, or the like. The adhesive base material ABM may include an organic adhesive material such as a PSA (pressure sensitive adhesive).

The adhesive base material ABM may be a material including third functional groups FG3. The third functional groups FG3 may be, for example, a carboxyl group, a carbonyl group, a hydroxy group, an ester group, an epoxy group, or the like.

In the adhesive layer 620, the first functional groups FG1-3 may chemically bond to the third functional groups FG3, respectively. Each of the first functional groups FG1-3 may chemically bond with a corresponding one of the third functional groups FG3. Each of the first functional groups FG1-3 may be hydrogen-bonded or covalently bonded to each of the third functional groups FG3. In the adhesive layer 620 according to an embodiment, the first functional groups FG1-3 included in the second light shielding material SM2 and the third functional groups FG3 included in the adhesive base material ABM may be chemically bonded to each other. Therefore, the second light shielding material SM2 may be uniformly dispersed in the adhesive layer 620, and the second light shielding material SM2 may be stably included in the adhesive layer 620, and thus the light incident inside the electronic device may be effectively blocked.

Figure 6A:
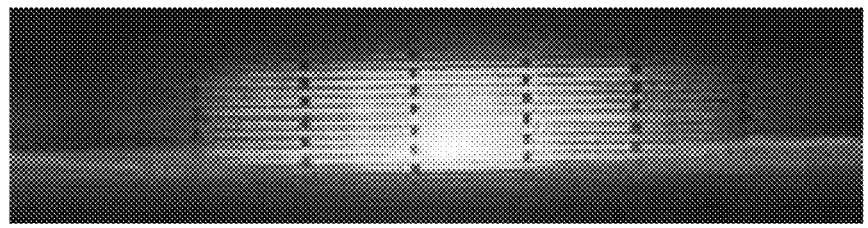
FIG. 6A is a captured image related to a light shielding characteristics evaluation result of an electronic device according to an embodiment of the disclosure.
Figure 6B:
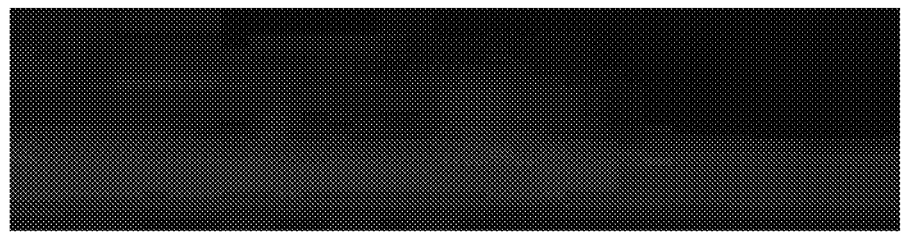
FIGS. 6B and 6C are captured images related to light shielding characteristics evaluation results of an electronic device according to Comparative Examples.
Figure 6C:
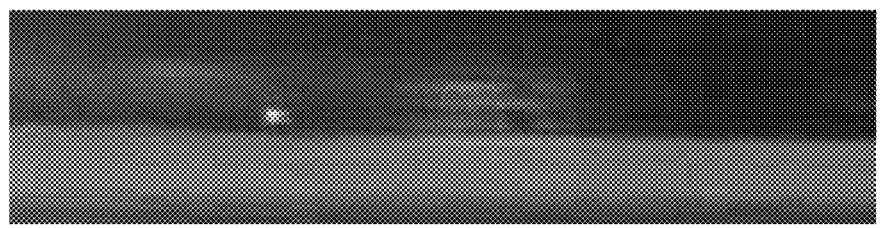

FIG. 6A is a captured image related to a result of evaluation of light shielding characteristics of an electronic device according to an embodiment. FIGS. 6B and 6C are captured images related to results of evaluation of light shielding characteristics of an electronic device according to Comparative Examples.

FIG. 6A is an image that is obtained by photographing an upper part of a metal plate of an electronic device according to an embodiment, in which a cover layer including a light shielding material is attached on a lower part of the metal plate by an adhesive layer including a light shielding material. FIG. 6B is an image that is obtained by photographing an upper part of a metal plate of an electronic device, which has the stacked structure of the disclosure and in which a cover layer disposed under the metal plate and an adhesive layer for bonding the cover layer do not include a light shielding material. FIG. 6C is an image that is obtained by photographing an upper part of a metal plate of an electronic device, which has the stacked structure of the disclosure and in which a cover layer disposed under the metal plate includes a light shielding material, and an adhesive layer for bonding the cover layer to the metal plate does not include a light shielding material. FIGS. 6A to 6C illustrate that the cover layer included a thermoplastic polyurethane film as a base film, the adhesive layer included an acrylic pressure sensitive adhesive film as a base film, and the light shielding material included reactive carbon black.

Referring to the captured image of FIG. 6A, in case that the cover layer including the light shielding material is attached to a lower part of the metal plate through the adhesive layer including the light shielding material, as in the electronic device according to an embodiment, it can be seen that an opening pattern formed in the metal plate is not visible because light incident from the outside is blocked. On the other hand, in case that both the cover layer disposed under the metal plate and the adhesive layer for bonding the cover layer do not include the light shielding material, as illustrated in FIG. 6B, it can be seen that the opening pattern is clearly visible, and, in case that the cover layer disposed under the metal plate includes the light shielding material and the adhesive layer for bonding the cover layer to the metal plate does not include the light shielding material, as illustrated in FIG. 6C, it can be seen that the opening pattern is partially visible. More specifically, in case that the cover layer including the light shielding material is attached to the lower part of the metal plate through the adhesive layer including the light shielding material as illustrated in FIG. 6A, an OD (optical density) value is measured as 5, but in case that the cover layer disposed under the metal plate and the adhesive layer for bonding the cover layer do not include the light shielding material as illustrated in FIG. 6B, the OD value is measured as 2.6, and, in case that the cover layer disposed under the metal plate includes the light shielding material, and the adhesive layer attaching the cover layer to the metal plate does not include the light shielding material, as illustrated in FIG. 6C, the OD value is measured as 3. Based on the measurement results, the electronic device according to an embodiment may effectively absorb and block the external light by attaching the cover layer including the light shielding material to the lower part of the metal plate through the adhesive layer including the light shielding material. Therefore, it can be seen that the display performance of the electronic device is prevented from being deteriorated by the light incident from a bottom of the electronic device.

According to an embodiment, the cushion layer that may be disposed between the lower protective film and the metal plate of the display panel may be omitted, and the cover film attached under the metal support member and the adhesive film attached thereto may include the light shielding material, and thus the impact resistance of the electronic device may be improved, and the light incident from the outside may be blocked. Therefore, the display efficiency of the electronic device may be improved.

While the disclosure has been described with reference to embodiments thereof, it will be apparent to those of ordinary skill in the art that various changes and modifications may be made thereto without departing from the spirit and scope of the disclosure as set forth in the following claims. Therefore, the disclosed subject matter should not be limited to any single embodiment described herein, and the scope of the claimed invention shall be determined according to the attached claims.

What is claimed is:

1. An electronic device comprising:
   a window;
   a display panel disposed under the window;
   a support member disposed under the display panel;
   a cover layer disposed under the support member and having a single-layered structure; and an adhesive layer disposed between the support member and the cover layer, wherein the adhesive layer directly contacts each of a lower surface of the support member and an upper surface of the cover layer, each of the adhesive layer and the cover layer includes a light shielding material, the cover layer further includes a cover base material including a silicone resin, a polyurethane resin, or a thermoplastic polyurethane resin, and a first functional group included in the light shielding material and a second functional group included in the cover base material are chemically bonded to each other.

2. The electronic device of claim 1, wherein
the support member includes a plate having metal, and
the cover layer is attached to a lower part of the plate by the adhesive layer.

3. The electronic device of claim 2, wherein the plate includes a first non-folding area, a folding area, and a second non-folding area arranged in a first direction, and the plate further includes a plurality of openings overlapping the folding area in a plan view.

4. The electronic device of claim 3, wherein the cover layer overlaps the folding area of the plate in a plan view.

5. The electronic device of claim 3, wherein the adhesive layer overlaps the folding area of the plate in a plan view.

6. The electronic device of claim 1, wherein the light shielding material included in each of the cover layer and the adhesive layer includes reactive carbon black.

7. The electronic device of claim 6, wherein
the adhesive layer further includes an adhesive base material including an acrylic resin, and
a first functional group included in the light shielding material and a third functional group included in the adhesive base material are chemically bonded.

8. The electronic device of claim 1, further comprising:
a light shielding layer disposed on the support member.

9. The electronic device of claim 8, further comprising:
a lower protective film disposed under the display panel, and
an additional adhesive layer disposed between the lower protective film and the light shielding layer,
wherein the additional adhesive layer contacts the lower protective film and the light shielding layer.

10. The electronic device of claim 8, wherein
the cover layer includes a first light shielding material,
the light shielding layer includes a second light shielding material, and
the first light shielding material and the second light shielding material are different from each other.

11. The electronic device of claim 1, further comprising:
a cushion member disposed between the support member and the display panel.

12. The electronic device of claim 1, further comprising:
a lower support member disposed under the cover layer.

13. The electronic device of claim 1, wherein the cover layer is a flexible film.

14. An electronic device comprising:
a display panel having a first state being flat or a second state being folded;
a support member disposed under the display panel, including a first non-folding area, a folding area, and a second non-folding area arranged in a first direction, the support member further including a plurality of openings overlapping the folding area in a plan view and allowing the support member to be more readily deformed;
a first adhesive layer disposed between the display panel and the support member, the first adhesive layer being removed in a contiguous region overlapping the plurality of openings in the plan view;
a cover layer disposed under each of the support member and the first adhesive layer, the cover layer overlapping at least the folding area in the plan view; and
a second adhesive layer disposed between the support member and the cover layer, wherein each of the cover layer and the second adhesive layer includes a light shielding material, and
the support member has an integrally formed structure.

15. The electronic device of claim 14, wherein the light shielding material included in each of the cover layer and the second adhesive layer includes reactive carbon black.

16. The electronic device of claim 14, wherein
the cover layer further includes a cover base material,
the second adhesive layer further includes an adhesive base material,
in the cover layer, the light shielding material is chemically bonded to the cover base material, and
in the second adhesive layer, the light shielding material is chemically bonded to the adhesive base material.

17. The electronic device of claim 14, wherein
the display panel comprises an active area and a peripheral area outside the active area,
in the plan view, the peripheral area does not overlap the second adhesive layer, and
a width of the support member in the first direction is greater than each of a width of the display panel in the first direction and a width of the cover layer in the first direction.

18. An electronic device comprising:
a window;
a display panel disposed under the window;
a metal plate disposed under the display panel;
a light shielding layer disposed directly on the metal plate;
a cover layer disposed under the metal plate and having a single-layered structure; and
an adhesive layer disposed between the metal plate and the cover layer, wherein
the adhesive layer directly contacts an upper surface of the cover layer and either a lower surface of the metal plate or a lower surface of the light shielding layer,
each of the adhesive layer and the cover layer includes a light shielding material, and
the cover layer further includes a cover base material including a silicone resin, a polyurethane resin, or a thermoplastic polyurethane resin, and
a first functional group included in the light shielding material and a second functional group included in the cover base material are chemically bonded to each other.

19. The electronic device of claim 18, wherein the metal plate includes a first non-folding area, a folding area, and a second non-folding area arranged in a first direction, and the metal plate further including a plurality of openings overlapping the folding area in a plan view, and the cover layer overlaps at least the folding area in a plan view.

20. The electronic device of claim 19, wherein
the light shielding layer comprises a plurality of openings, and each of the plurality of openings in the light shielding layer overlaps a correspondingly different opening among the plurality of openings in the metal plate in the plan view.

\* \* \* \* \*